United States Patent
Jenkins et al.

(10) Patent No.: US 7,239,064 B1
(45) Date of Patent: Jul. 3, 2007

(54) RESETTABLE LATCHING MEMS TEMPERATURE SENSOR APPARATUS AND METHOD

(75) Inventors: Arthur Anthony Jenkins, Madison, AL (US); Michael Scott Kranz, Madison, AL (US); Marty Ray Williams, Huntsville, AL (US)

(73) Assignee: Morgan Research Corporation, Huntsville, AL (US)

( * ) Notice: Subject to any disclaimer, the term of this patent is extended or adjusted under 35 U.S.C. 154(b) by 53 days.

(21) Appl. No.: 11/138,108

(22) Filed: May 26, 2005

Related U.S. Application Data

(60) Provisional application No. 60/619,407, filed on Oct. 15, 2004.

(51) Int. Cl.
    *H01H 71/16* (2006.01)
    *H02N 10/00* (2006.01)

(52) U.S. Cl. .......................... 310/307; 337/36; 337/75

(58) Field of Classification Search ........ 310/306–307; 337/36, 75; 200/181
See application file for complete search history.

(56) References Cited

U.S. PATENT DOCUMENTS

| | | | |
|---|---|---|---|
| 4,400,634 A | 8/1983 | Micheron | |
| 4,916,349 A | 4/1990 | Kornrumpf | |
| 5,382,864 A | 1/1995 | Morikawa et al. | |
| 5,463,233 A | 10/1995 | Norling | |
| 5,515,725 A | 5/1996 | Tabota et al. | |
| 5,917,226 A | 6/1999 | Chan et al. | |
| 6,044,646 A | 4/2000 | Silverbrook | |
| 6,246,155 B1 | 6/2001 | Nishihara et al. | |
| 6,262,516 B1 | 7/2001 | Fukuda et al. | |
| 6,396,382 B1 | 5/2002 | Ross | |
| 6,404,098 B1 * | 6/2002 | Kayama et al. | 310/307 |
| 6,407,478 B1 * | 6/2002 | Wood et al. | 310/307 |
| 6,483,056 B2 | 11/2002 | Hyman et al. | |
| 6,504,118 B2 | 1/2003 | Hyman et al. | |
| 6,624,730 B2 * | 9/2003 | Johnson et al. | 335/78 |
| 6,698,201 B1 | 3/2004 | Sarkar et al. | |
| 6,756,795 B2 | 6/2004 | Hunt et al. | |
| 6,812,820 B1 | 11/2004 | Fouillet | |
| 6,853,765 B1 | 2/2005 | Cochran | |
| 2002/0074901 A1 | 6/2002 | Johansson | |
| 2002/0149296 A1 | 10/2002 | Fujii et al. | |

(Continued)

OTHER PUBLICATIONS

Geear, M.C.; Yeatman, E.M.; Holmes, A.S.; Syms, R.R.A.; Finlay, A.P "Microengineered electrically resettable circuit breaker"; Microelectromechanical Systems, Journal of; vol. 13, Issue 6, Dec. 2004, pp. 887-894.*

*Primary Examiner*—Burton Mullins
(74) *Attorney, Agent, or Firm*—Greenberg Traurig, LLP; Paul F. McQuade

(57) ABSTRACT

The Resettable Latching MEMS Temperature Sensor provides the capability of recording external temperature extremes without consuming electrical power. The device incorporates a thermal bimorph, contacts, latches, and actuators for device reset. The device can be designed, hardwired, or programmed to trigger at various temperature levels. The device can be fabricated in a simple micromachining process that allows its size to be miniaturized for embedded and portable applications. During operation, the device consumes no quiescent power. The device can be configured to close a circuit, switch an interrupt signal, or switch some other electrical trigger signal between devices at the time of a temperature extreme being reached, or it can be configured to latch and be polled at some time after the temperature limit has occurred.

28 Claims, 10 Drawing Sheets

U.S. PATENT DOCUMENTS

2004/0084997 A1  5/2004  Arbogast et al.
2004/0164649 A1  8/2004  Xu et al.
2004/0182182 A1  9/2004  Nishihara et al.
2005/0146404 A1* 7/2005  Yeatman ...................... 335/78
2005/0189204 A1* 9/2005  Yeatman et al. ............ 200/181

* cited by examiner

Figures 2B-H

RESETTABLE LATCHING MEMS TEMPERATURE SENSOR APPARATUS AND METHOD

REFERENCE TO RELATED APPLICATIONS

This application claims priority to Provisional Patent Application U.S. Ser. No. 60/619,407, entitled "Resettable Latching MEMS Temperature Sensor" and filed on Oct. 15, 2004, which is fully incorporated herein by reference.

GOVERNMENT LICENSE RIGHTS

This invention was made with Government support under contract MDA972-03-C-0010, awarded by the Defense Advanced Research Projects Agency ("DARPA"). The Government has certain rights in the invention.

BACKGROUND

1. Field of the Invention

The present invention relates generally to a temperature sensor and method for ring temperature. More particularly, the present invention relates to a low-power micro-mechanical temperature sensor using a micromechanical thermal bimorph structure.

2. Background of the Invention

Embedding miniature sensors in products, systems, storage and shipping containers, and other items allows the monitoring of those items to determine health, maintenance needs, lifetime, and other item characteristics. Information from miniature temperature sensors can tell a user whether the item has been exposed to temperature levels that can cause damage. In addition, miniature temperature sensors can be used to "wake up," from a low-power sleep mode, a more sophisticated sensing system to collect a more complete set of environmental data.

Current battery-powered embedded sensor systems that perform this type of monitoring often require a low power method of determining when a certain level of temperature has been reached. Many other applications, such as in transportation and shipping monitoring, heating and air conditioning, and food storage, would benefit from the ability to monitor the temperature environment with a completely unpowered sensor. In addition, these applications would benefit from the ability to poll that sensor to determine if a temperature extreme was reached, and then reset the sensor for later use. In either case, an ultra-low power sensor, or even a sensor that consumes no quiescent power, would reduce the overall system power consumption enough to allow embedded sensors to operate for decades in portable battery powered applications, or in systems that scavenge small amounts of power from the environment.

Low power and unpowered temperature sensors currently exist. However, they are large-scale devices such as bimetallic strips in standard thermostats. These devices operate in a somewhat similar fashion (albeit on a much larger scale) and provide a somewhat similar function as the present invention, but are not in a form factor suitable for integration with microdevices, and are not fabricated using techniques that are compatible with microelectronics or micro-electromechanical systems ("MEMS") devices.

Micro-scale temperature sensors exist, as well, but most of the previous work to develop low-power temperature sensors has been focused on minimizing the power consumption of standard miniature devices, and using low-power analog electronics to determine when a specific temperature level has been reached. These devices and systems would then create a low-impedance logic level signal for input to a sleeping microcontroller. The fundamental problem is that such a system must continuously power the temperature sensor and analog trigger circuitry, creating a constant power draw on the batteries. Even using the latest in low-power devices and highest capacity batteries, systems that continuously power any sensor will only operate for 5-10 years.

As embedded miniature sensors get smaller, and as batteries are reduced in size and capacity, the use of lower power and unpowered devices will become more critical. Furthermore, maximizing the sensor functionality, without increasing power consumption, will enhance the capability of embedded sensing systems.

Other inventions have used thermally actuated micromachined devices to measure temperature, and for switching, but none have had the advantages of the present invention in combining low- or no-power operation with a mechanical latching function.

For example, U.S. Pat. No. 5,917,226, entitled "Integrated Released Beam, Thermo-mechanical Sensor for Sensing Temperature Variations and Associated Methods," provides an integrated circuit for sensing temperature variations using a thermal bimorph device, but the sensor does not have a latching function and does not operate without quiescent power.

U.S. Pat. No. 4,916,349, entitled "Latching Piezoelectric Relay," utilizes a thermal bimorph in a latching piezoelectric relay. This invention requires the application of external power to cause the relay to latch and has a latching function that is piezoelectric and not mechanical.

U.S. Pat. No. 5,463,233, entitled "Micromachined Thermal Switch," utilizes a thermal bimorph device as a temperature-activated switch, but this invention does not have a latching capability.

SUMMARY OF THE INVENTION

It is therefore an object of the present invention is to provide a low-power micro-machined temperature sensor.

It is another object of the present invention to provide a micromachined temperature sensor that latches upon reaching a threshold temperature without the application of any external power.

It is yet another object of the present invention to provide a micromachined temperature sensor that is easily re-set for reuse.

The present invention utilizes a micromachined thermal bimorph structure. A thermal bimorph is a thin film consisting of two layers of different materials that expand at different rates when exposed to heat, so that one layer expands more than the other upon a temperature increase, and the bimorph bends. Under a temperature load of sufficient magnitude, the thermal bimorph deflects and latches, closing an electrical contact. External circuitry can then be used to poll the temperature sensor. A thermal, capacitive, or other actuator resets the temperature sensor by disengaging the latch and returning the bimorph to its original position. The sensor will use nearly zero power except when actually providing the trigger signal to the microcontroller or during any reset operation. The sensor can remain latched for interrogation at a later date, even if system power is lost, and the sensor can be reset to detect the next event.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

These and other embodiments of the present invention will also become readily apparent to those skilled in the art from the following detailed description of the embodiments having reference to the attached figures, the invention not being limited to any particular embodiment(s) disclosed.

Figure 1:
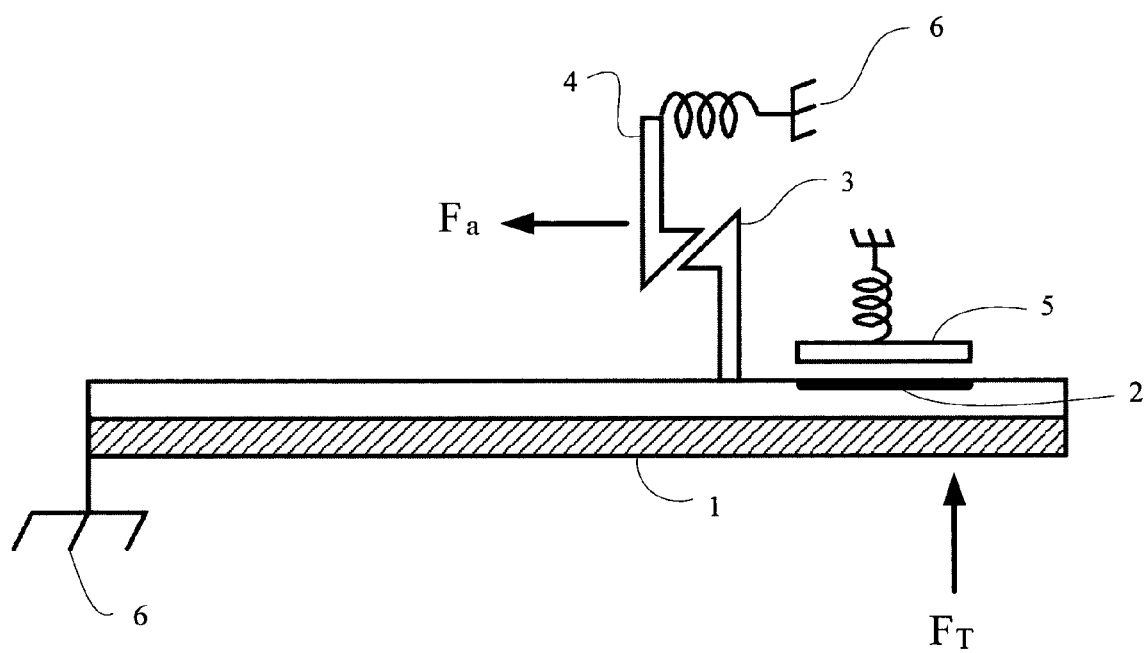
FIG. 1 is a schematic diagram of the temperature sensor and its components.

Repeat use of reference characters throughout the present specification and appended drawings is intended to represent the same or analogous features or elements of the invention.

DETAILED DESCRIPTION

The illustrated embodiment of the invention is fabricated in a thick layer of silicon or other conductor material. Within this thick layer of material, a thermal bimorph, a set of flexures, multiple contacts, multiple latch and pawl structures, multiple actuators, and multiple anchors and pads are fabricated. The thermal bimorph consists of a cantilever beam made from the conductor material and a sidewall coating of a different material with a coefficient of thermal expansion mismatch to the conductor material. Upon application of a temperature load, the thermal bimorph will bend so that the free end moves in a lateral direction (i.e., in a direction parallel to the substrate).

FIG. 1 illustrates a schematic diagram of one embodiment of the invention. The invention utilizes a micromachined cantilever bimorph structure 1 attached to the substrate (not illustrated) via anchors 6. The bimorph structure 1 includes a contact area 2 and a latch 3. Under a temperature load, T, the bending moment of the bimorph yields a force, $F_T$, that displaces the bimorph sufficiently to force the latch 3 to engage with a similar latch on a thin flexure or pawl 4 attached to the substrate via anchors 6. The force also causes the bimorph contact area 2 to connect with a spring-loaded contact 5. After latching, the contacts remain closed, and the temperature sensor can then be interrogated by external circuitry (not illustrated). A thermal, capacitive, or other actuator (discussed below) can be used to develop a force, $F_a$, and disengage the pawl 4 and return the bimorph 1 to its original position.

Figure 2A:
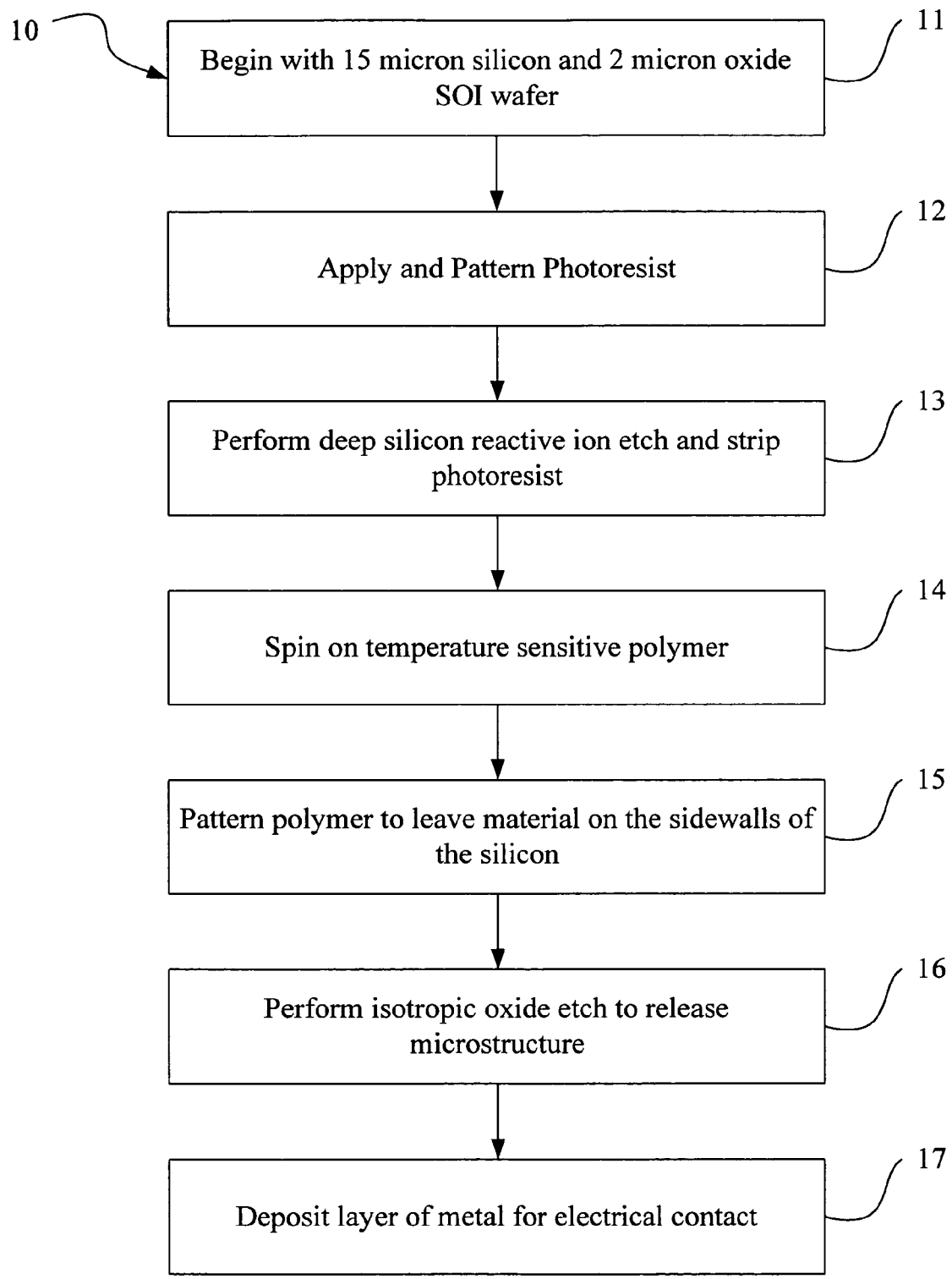
FIG. 2A is a high-level flowchart for an embodiment of a process according to the present invention.

FIG. 2A illustrates the high-level process flow 10 for the process used to fabricate the lateral-moving thermal bimorph that is used in one embodiment of the invention. While the following discussion focuses on producing a silicon/polyimide thermal bimorph with the process discussed herein, other combinations of materials and other processes can be employed.

Figure 2B:
FIGS. 2B-2H illustrate steps in the process of fabricating one embodiment of the present invention.
Figure 2C:

Employing the process of FIGS. 2A and 2B, the starting material is a silicon-on-insulator ("SOI") substrate with a handle wafer 20 and a 15-micron thick active silicon layer 22 separated by a 2 micron thick silicon dioxide layer 21. With attention to FIG. 2C, which illustrates step 12 in greater detail, the SOI wafer is first patterned with photoresist 23 using standard lithography to define a silicon cantilever beam 24 with dovetail features.

Figure 3:
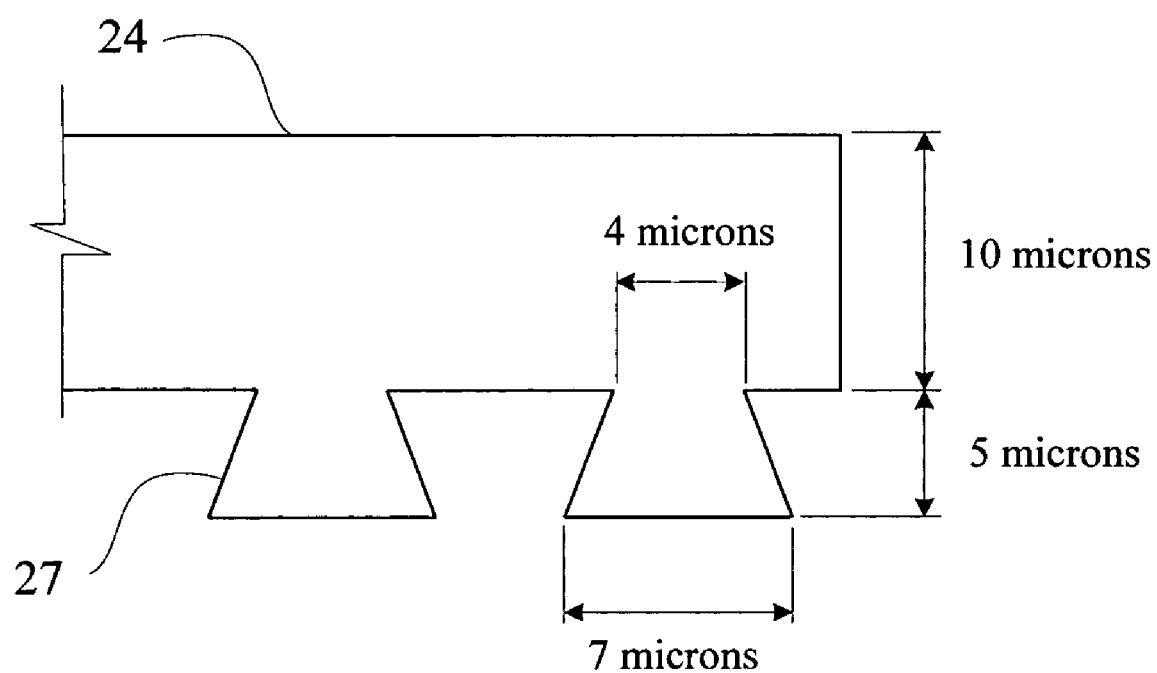
FIG. 3 is a partial top view of the invention illustrating the dovetail dimensions for one embodiment of the thermal bimorph beam.

FIG. 3 illustrates the beam 24 with its dovetail features 27. The dovetail features 27 of the beam 24 are designed to improve the adhesion of the subsequent second bimorph material to this first material. The dimensions shown in FIG. 3 illustrate one set of possible dimensions for defining the dovetail, although other dimensions and other surface treatments known to one with skill in the art could be employed to improve the adhesion of the second bimorph material to the first material.

Figure 2D:
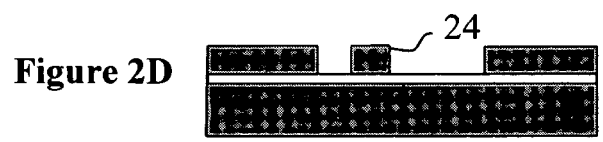
Figure 2E:
Figure 2F:
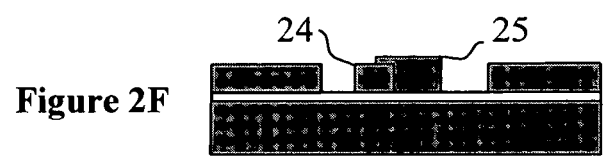

As illustrated in FIG. 2D, which shows step 13 of the fabrication process, a deep silicon reactive ion etch defines the structure of the silicon beam 24. FIG. 2E (step 14) illustrates a temperature sensitive polymer 25 that is applied by spin coating after the deep silicon etch. This layer of polymer 25 is then patterned as shown in FIG. 2F (step 15) to allow portions of the polymer 25 to remain in place along the sidewalls of the silicon beam 24. This polymer 25 forms the temperature sensitive material for the bimorph(s) in the device.

Figure 4:
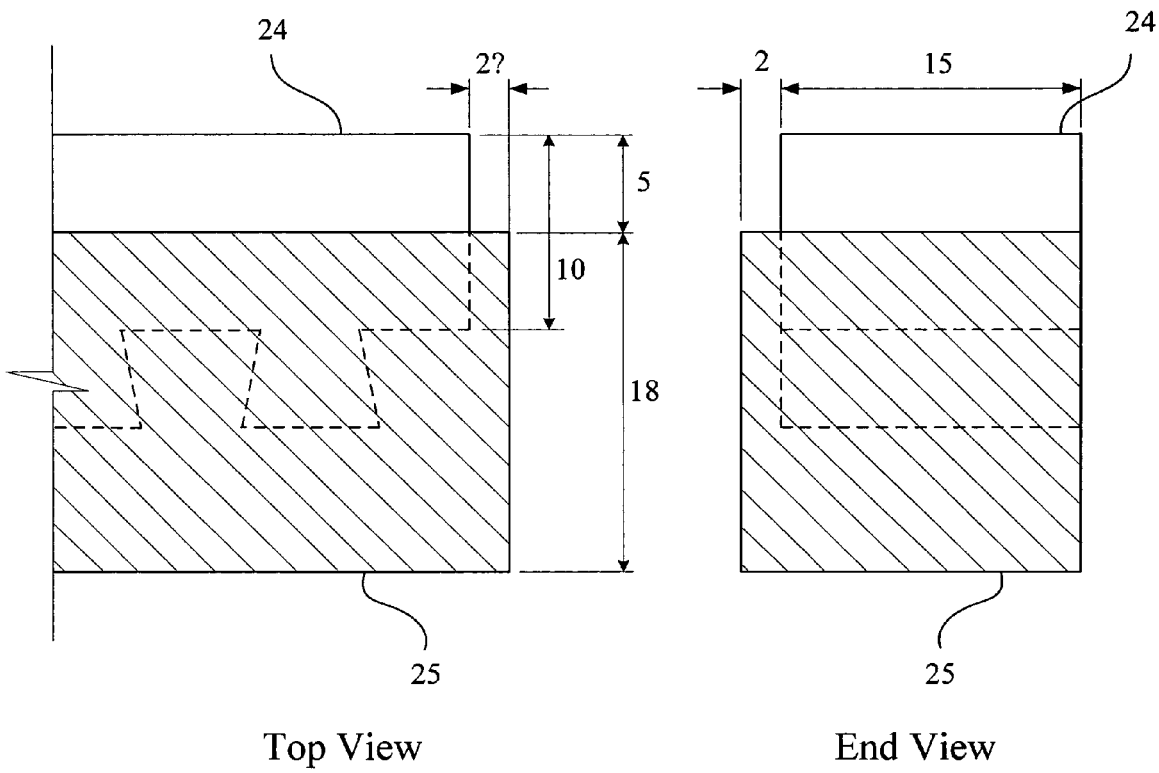
FIG. 4 is a partial top view of the invention illustrating the dimensions of one embodiment of the silicon/polyimide layers of the bimorph.

In one embodiment of the invention, the polymer 25 is deposited with dimensions approximating those illustrated in FIG. 4 (dimensions in microns). The 2 micron overlapping of the polymer 25 onto the silicon 24 at the end of the silicon beam 24 is necessary to allow polymer shrinkage during cure and developing.

Figure 2G:
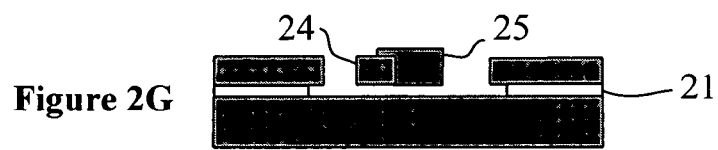
Figure 2H:
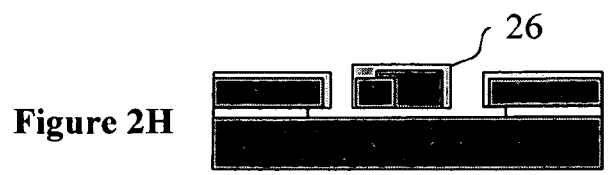

As is illustrated in FIG. 2G (step 16), after the polymer pattern is transferred and the polymer is developed, the silicon dioxide layer 21 in between the silicon layers is removed with an isotropic oxide etch that allows portions of the layer 21, specifically those underneath anchors and bond pads (not illustrated), to remain and hold the structure to the substrate. After the silicon 24/polymer 25 structure is released from the substrate, the entire device is coated at an angle with a metal layer system using a process that places metal 26 on the sidewalls of the structure, as illustrated in FIG. 2H (step 17). This metal is critical as it forms the contacts that the sensor uses.

Figure 5:
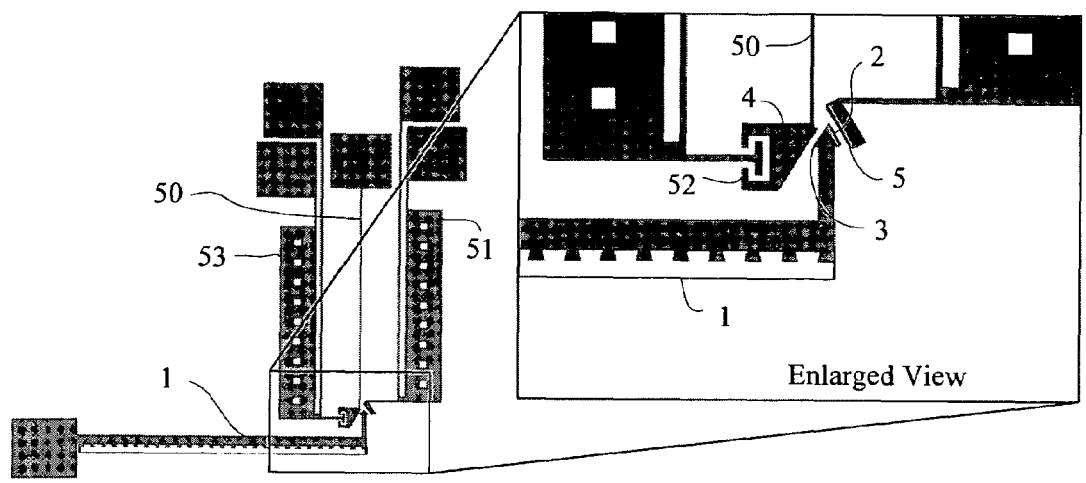
FIG. 5 is a top view of the illustrated embodiment of the sensor in its normal state and ready to sense temperature extremes.
Figure 6:
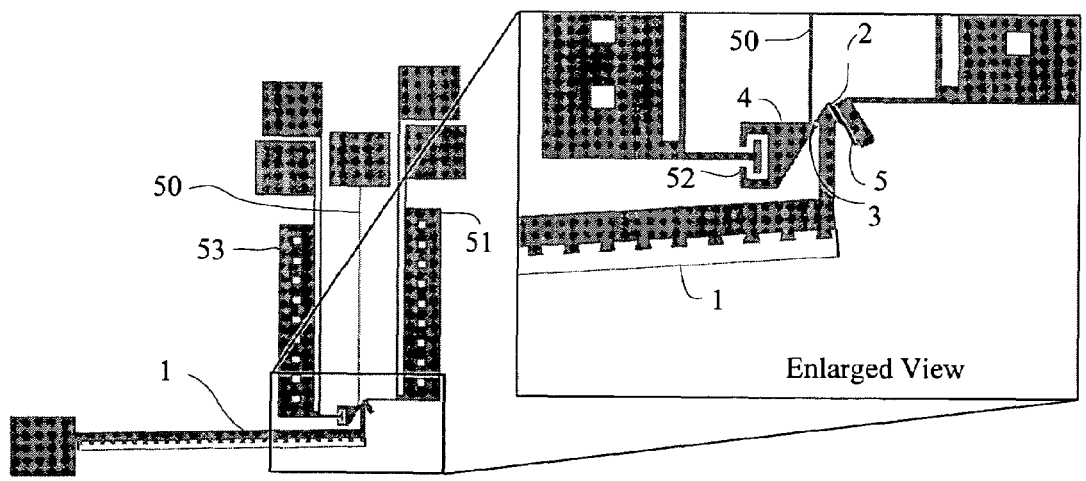
FIG. 6 is a diagram of the illustrated embodiment of the sensor in its latched and contacted state after a temperature extreme has been reached.

FIG. 5 illustrates an embodiment of the invention that provides both a latch signal and a programmable trigger signal depending on the level of external temperature. The thermal bimorph 1 responds to temperature levels by bending and displacing itself in the +y direction. The latch 3 on the bimorph 1 is separated from the pawl 4 by a predetermined distance selected for the temperature level at which the temperature sensor is desired to latch. If that temperature level is achieved, the bimorph 1 and latch 3 will move the distance required to engage the latch 3 with the pawl 4. A very flexible beam 50 allows the pawl 4 to move easily perpendicular to the motion of the bimorph 1, and to engage with the latch 3 to prevent the bimorph 1 from returning to its initial state. At this point, the temperature sensor is in its latched state and a closed contact exists between the bimorph 1 and pawl 4. This closed contact can function to signal a microcontroller or to allow interrogation by an external reader. FIG. 6 illustrates the temperature sensor in a latched state.

In addition, when the bimorph is deflected by a temperature, the contacts 2 on the sidewalls of the latch 3 may connect with the contacts 5 that are anchored to the substrate. The surface of the contact sidewalls (2 and 5) are designed to provide reliable and low-resistance contact. The contact actuator 51 connected to the contacts 5 allows the distance between the contacts 5 and the latch contacts 2 to be varied, thereby modifying the temperature level required to make contact and providing user programmability. When the contacts 5 connect to the latch contacts 2, a circuit can be closed that can provide a signal to a microcontroller or be interrogated by an external reader. The temperature level for making a contact between the bimorph and the primary contacts may or may not be the same as that for latching depending on the setting of the contact actuator and the design of the latching mechanism. In other embodiments of the invention, the latching temperature can be adjusted as well.

The temperature sensor is designed to be reset after the sensor (in its latched state) is read or used to provide a signal to an external system. The invention includes a mechanical linkage 52 on the pawl 4 that creates a mechanical connection to a unidirectional reset actuator 53. When the temperature sensor is unlatched and ready to sense a temperature event, the mechanical linkage 52 is not in contact with the pawl 4. As the temperature event occurs, the latch 3 on the bimorph 1 makes contact with the pawl 4 and forces it to move perpendicular to the motion of the bimorph 1. The mechanical linkage 52 decouples the latching motion of the pawl 4 from the reset actuator 53. Without this mechanical linkage, the reset actuator 53 would apply a stiff resistance to the latching motion, making the sensing of low temperature levels difficult.

After the sensor is in a latched state, the reset actuator 53 can be forced to pull in a direction that will engage the linkage 52 with the pawl 4. The illustrated embodiment of the invention uses for the reset actuator 53 a thermal actuator that deflects when a specific amount of current is run through the device. Once the actuator 53 is engaged with the pawl 4, the force from the reset actuator 53 will pull the pawl 4 away from the bimorph 1. When sufficient force is applied, the latch 3 and pawl 4 disengage, thereby releasing the bimorph 1 and allowing it to return to its initial position. At this point, the sensor is ready to monitor another temperature event.

Figure 7:
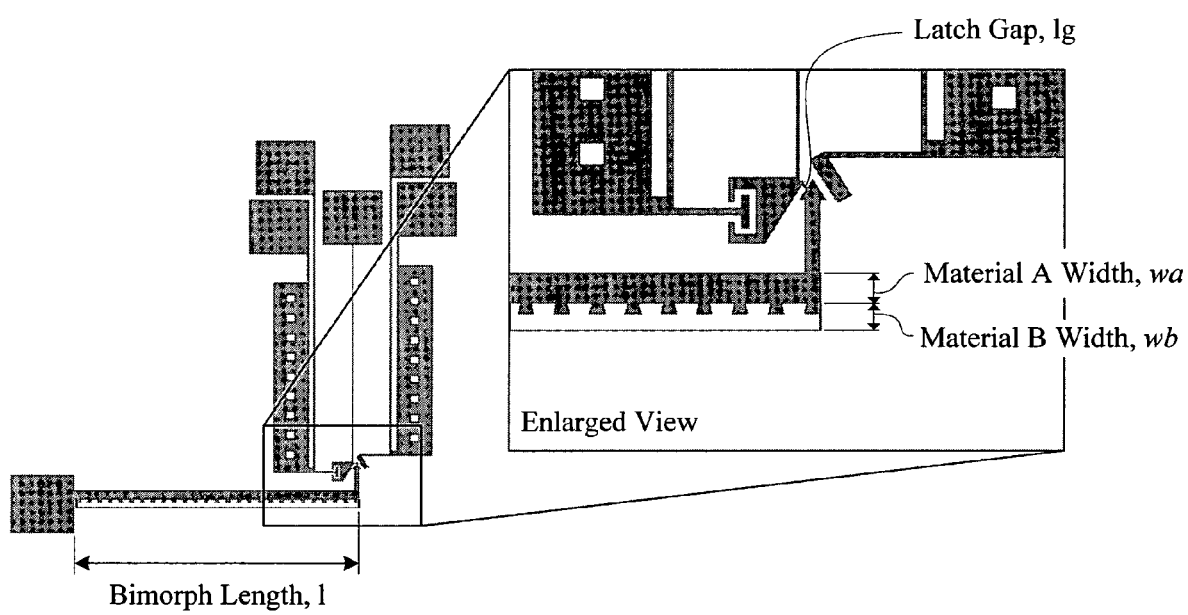
FIG. 7 shows the definition of parameters used in the design of the sensor.

FIG. 7 defines the primary parameters used to design one embodiment of the sensor to detect specific levels of temperature. For a thermal bimorph, the radius of curvature, R, at temperature, T, is given approximately by:

$$R = \frac{wa + wb}{6(\alpha_a - \alpha_b)(T - T_o)}$$

where wa and wb are the widths of materials A and B respectively in the bimorph, $\alpha_a$ and $\alpha_b$ are the coefficients of thermal expansion for materials A and B respectively, and $T_o$ is the temperature at which the bimorph is not bent.

The amplitude of the deflection of the bimorph beam is dependent on the radius of curvature and beam length, and is given by:

$$\Delta y = R * \left(1 - \cos\left(\frac{l}{R}\right)\right)$$

$\Delta y$ is the bimorph beam displacement, R is the radius of curvature, and l is the length of the beam.

A device will latch if the bimorph deflection is greater than the distance of the latch gap plus the distance across the tip of the pawl, and can be expressed by the following latching condition:

$$\Delta y > lg + lp, \text{ or } (T - T_o) > \frac{(wa + wb)*(lg + lp)}{3(\alpha_a - \alpha_b)*l^2}$$

where lg is the latch gap distance and lp is the distance across the tip of the pawl over which the latch structure must traverse to latch. That distance is defined by the geometry of the tip of the Table 1 below contains the temperature levels required for latching the sensor in one embodiment of the invention given Material A width of 10 μm, Material B width of 10 μm, and latching gap of 10 μm for a variety of bimorph lengths.

TABLE 1

Table of design parameters versus temperature levels for latching

| Temperature Level | Bimorph Beam Length, lb |
|---|---|
| 50° C. | 375 μm |
| 75° C. | 263 μm |
| 100° C. | 215 μm |
| 125° C. | 186 μm |

In one embodiment of the invention Material A is silicon and Material B is Polyimide. Other metals would be suitable for use as Material A, and other materials would be suitable for use as Material B, provided that the materials have a large enough coefficient of thermal expansion to yield a deflection large enough to close the latch gap.

In one embodiment of the invention, the temperature sensor is used to wake up a microcontroller in an embedded sensing application. In other embodiments, the device is used in standalone applications where the sensor is connected to an RFID tag or other transmitter for remote determination of the temperature environment experienced by shipping containers and products. Similar devices for other environmental variables such as shock, humidity, and chemical concentrations can be developed using the principles disclosed herein.

Figure 8:
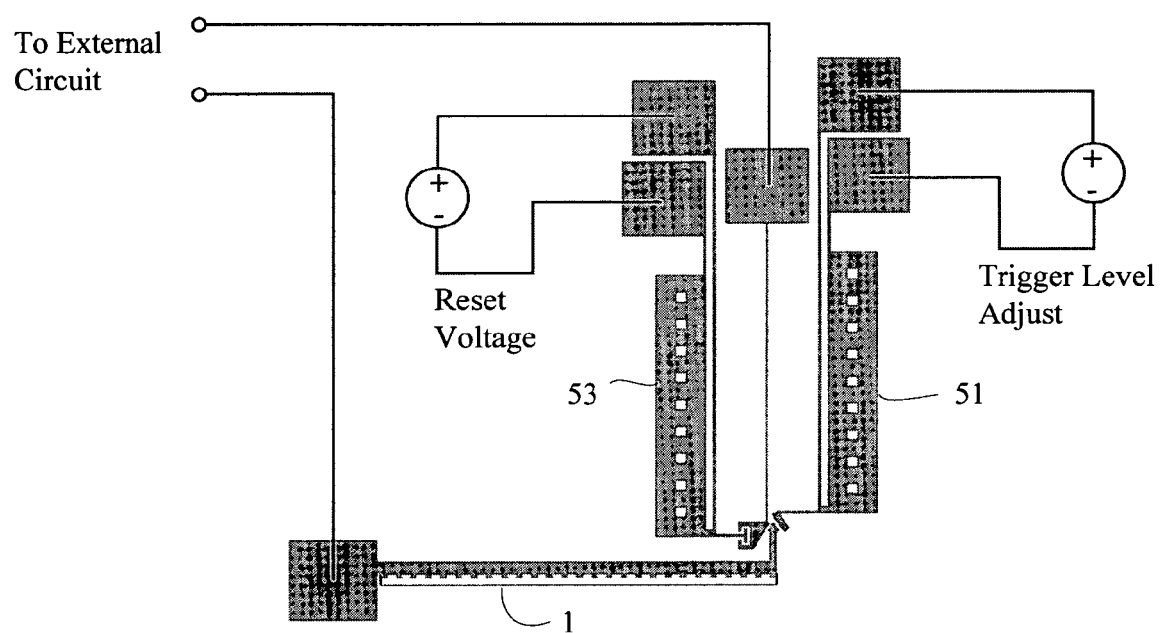
FIG. 8 is a diagram of electrical interconnection of the sensor.

FIG. 8 illustrates a wiring schematic for an embodiment of the invention that is used for waking up an embedded microcontroller from a sleep mode when a certain temperature level is experienced. In this embodiment, a voltage difference is applied across actuators 53 and 51. In operation a single bias signal is applied to the bimorph 1 of the device. The bias signal could be a voltage or current depending upon the type of readout circuit used. Connections to the external contacts and pawls would be outputs to which the bias signal is connected. These outputs could be connected to microcontroller interrupt lines, to a wireless transceiver, to a large circuit network that performs some function, or a number of other connection and circuits.

Although several embodiments and forms of this invention have been illustrated, it is apparent that those skilled in the art can make other various modifications and embodiments of the invention without departing from the scope and spirit of the present invention. For example, other configurations of the sensor are possible that utilize varying surface features on the contacts, multiple movable contacts, and different actuator types.

Figure 9:
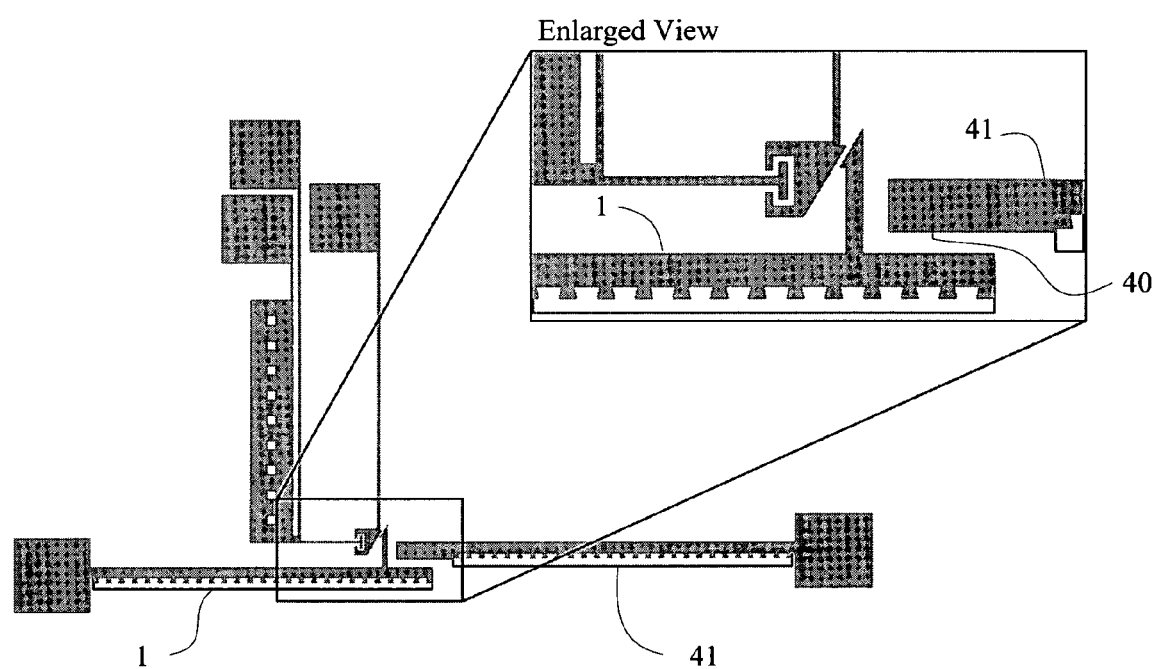
FIG. 9 shows an embodiment of the invention with shock sensitive contacts that allow operation at lower temperature levels.

One particular embodiment of the invention, shown in FIG. 9, uses the sidewall 40 of a second thermal bimorph 41 as a moving contact to connect with the sensor's main latching bimorph 1. When a temperature load is applied, the moving contact 41 will move out of the way of the main latching bimorph 1 during the latching operation, thereby reducing the amount of force required to meet the latching condition. After the latching occurs and the temperature load is removed from the device, the moving contact 41 will return to its original position and make a connection with the device's main latching bimorph 1. This configuration is useful when designing low temperature trigger devices where the bending force may be insufficient to overcome the retarding force created by the stationary electrical contacts.

Figure 10:
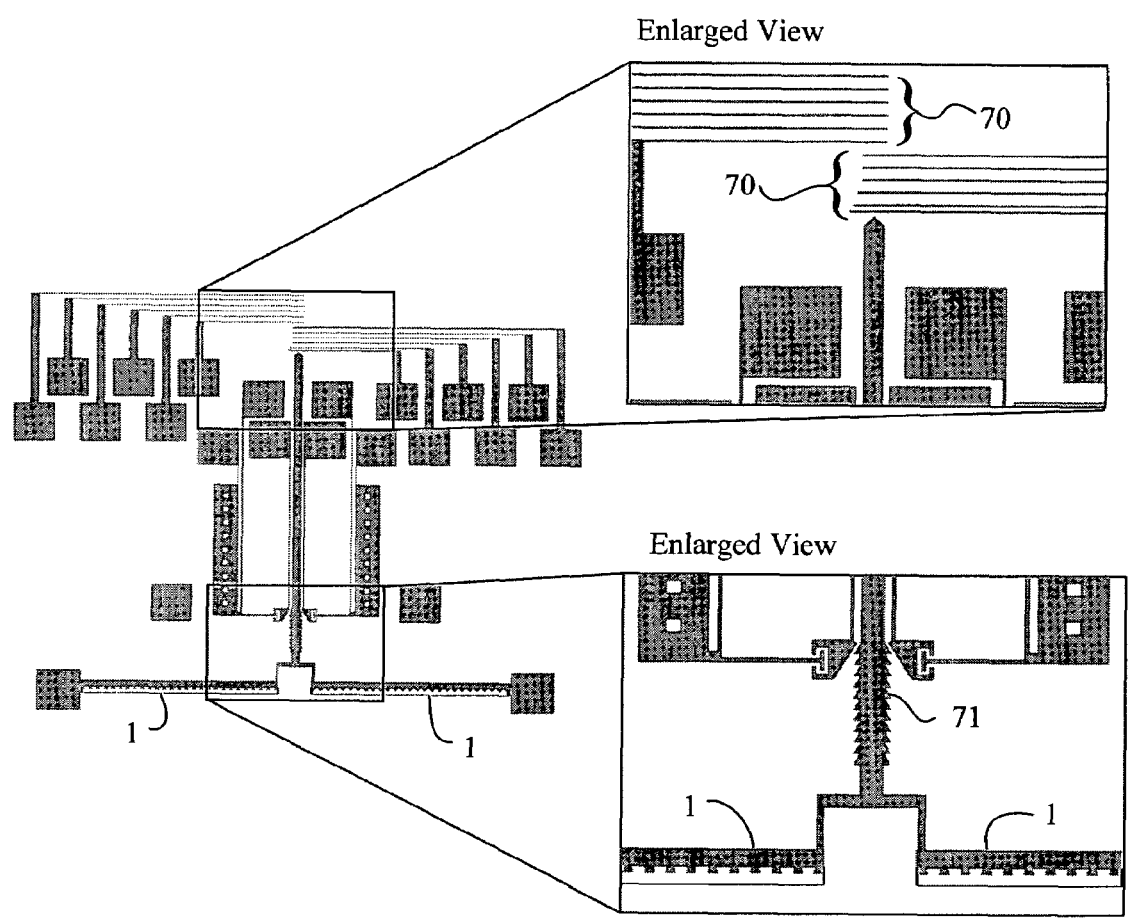
FIG. 10 shows an embodiment of the invention with multiple contacts for detection of multiple temperature levels.

Another embodiment, shown in FIG. 10, includes multiple contacts 70 and multiple latches 71 to allow one sensor device to trigger at and latch at multiple temperature levels that the bimorphs 1 are subjected to.

Another embodiment of the device (not illustrated) uses a capacitive actuator for reset functions instead of a thermal actuator. A capacitive actuator consumes less power but would be suitable for lower force and lower temperature level applications. The configuration would require additional capacitive actuators on the bimorph to move it out of contact with the pawl, thereby eliminating the friction that holds the pawl in contact with the latch. At that point another capacitive actuator could move the pawl out of position, after which the actuator on the bimorph is released, followed by the release of the pawl, at which point the sensor is unlatched and ready for another sensing operation.

Furthermore, other fabrication processes for the device are possible. Any fabrication process that realizes a single thick micromechanical structural layer with 1) conducting sidewalls that can make electrical contact, and 2) sidewall deposition of a material with a different coefficient of thermal expansion from the main micromechanical structural layer can be used to fabricate the device. Examples include bulk micromachining and wafer-bonding fabrication approaches in silicon, silicon dioxide, nickel, titanium and other conductors, as well as LIGA-type fabrication processes using electroplated metals.

Although the embodiments illustrated herein show temperature sensors in which the bimorph responds to temperature increases in order to cause either contact or latching of the sensor, the bimorph also responds to temperature decreases, by bending in the opposite direction. Therefore, other embodiments contemplated that are within the scope of the present invention include devices which sense either temperature decreases or both increases and decreases with the same thermal bimorph.

What is claimed is:

1. A micro-electromechanical temperature sensor device, comprising:
   a thermal bimorph comprising
      a first mechanical latch and
      a first electrical contact; and
   a pawl comprising a second mechanical latch, the second mechanical latch disposed at a latching distance from the first mechanical latch, the latching distance corresponding to a latching threshold temperature; and
   a second electrical contact disposed at an electrical contact distance from the first electrical contact, the electrical contact distance corresponding to an electrical contact threshold temperature;
   wherein the first mechanical latch moves toward the second mechanical latch and the first electrical contact moves toward the second electrical contact when the thermal bimorph experiences a temperature change in the direction of the latching threshold temperature; and
   wherein the first mechanical latch engages with the second mechanical latch when the temperature reaches the latching threshold temperature; and wherein the first electrical contact contacts with the second electrical contact when the temperature reaches the electrical contact threshold temperature.

2. The micro-electromechanical temperature sensor device of claim 1, further comprising an unlatching means to release the second mechanical latch from the first mechanical latch.

3. The micro-electromechanical temperature sensor device of claim 2, further comprising an unlatching means to release the second mechanical latch from the first mechanical latch, whereby the thermal bimorph is free to return towards its original position.

4. The micro-electromechanical temperature sensor device of claim 2, wherein the unlatching means comprises a first actuator mechanically coupled to the pawl.

5. The micro-electromechanical temperature sensor device of claim 1, further comprising a first actuator mechanically coupled to the pawl for unlatching the first mechanical latch from the second mechanical latch.

6. The micro-electromechanical temperature sensor device of claim 5, wherein the first actuator is electromechanically linked to the pawl for moving the second mechanical latch thereby varying the latching distance.

7. The micro-electromechanical temperature sensor device of claim 5, further comprising a second actuator electromechanically linked to the second electrical contact for moving the second electrical contact thereby varying the electrical contact distance.

8. The micro-electromechanical temperature sensor device of claim 5, wherein the first actuator does not engage the pawl during latching.

9. The micro-electromechanical temperature sensor device of claim 5, wherein the first actuator does not apply a mechanical load onto the pawl during latching.

10. The micro-electromechanical temperature sensor device of claim 5, wherein the first actuator engages the pawl for unlatching the second mechanical latch from the first mechanical latch.

11. The micro-electromechanical temperature sensor device of claim 5, wherein the first actuator comprises a thermal actuator.

12. The micro-electromechanical temperature sensor device of claim 7, wherein the second actuator comprises a thermal actuator.

13. The micro-electromechanical temperature sensor device of claim 5, wherein the first actuator comprises a capacitive actuator.

14. The micro-electromechanical temperature sensor device of claim 7, wherein the second actuator comprises a capacitive actuator.

15. The micro-electromechanical temperature sensor device of claim 5, wherein the thermal bimorph comprises a laterally-moveable cantilever-mounted thermal bimorph having a free end.

16. A micro-electromechanical temperature sensor device, comprising:
   a thermal bimorph comprising a first mechanical latch having a first electrical contact; and
   a pawl comprising a second mechanical latch having a second electrical contact, the second mechanical latch disposed at a distance from the first mechanical latch, the distance corresponding to a threshold temperature;
   wherein the first mechanical latch and the first electrical contact move toward the second mechanical latch and the second electrical contact when the thermal bimorph experiences a temperature change in the direction of the threshold temperature; and
   wherein the first mechanical latch engages with the second mechanical latch and the first electrical contact contacts with the second electrical contact when the temperature reaches the threshold temperature.

17. The micro-electromechanical temperature sensor device of claim 16, further comprising a first actuator mechanically coupled to the pawl for unlatching the first mechanical latch from the second mechanical latch.

18. The micro-electromechanical temperature sensor device of claim 17, wherein the first actuator is electromechanically linked to the pawl for moving the second mechanical latch thereby varying the latching distance.

19. The micro-electromechanical temperature sensor device of claim 17, wherein the first actuator does not engage the pawl during latching.

20. The micro-electromechanical temperature sensor device of claim 17, wherein the first actuator does not apply a mechanical load onto the pawl during latching.

21. A micro-electromechanical temperature sensor device, comprising:
   a first thermal bimorph comprising
   a first mechanical latch and
   a first electrical contact; and
   a pawl comprising a second mechanical latch, the second mechanical latch disposed at a latching distance from the first mechanical latch, the latching distance corresponding to a latching threshold temperature; and
   wherein the first mechanical latch moves toward the second mechanical latch when the thermal bimorph experiences a temperature change in the direction of the latching threshold temperature; and
   wherein the first mechanical latch engages with the second mechanical latch when the temperature reaches the latching threshold temperature; and
   a second thermal bimorph having a free end, the free end comprising a second electrical contact positioned so as to make an electrical contact with the first electrical contact after the first and second mechanical latches have latched.

22. A micro-electromechanical temperature sensor device, comprising:

a thermal bimorph comprising
   a plurality of latches disposed at a plurality of latching distances from at least one holding latch, the plurality of latching distances corresponding to a plurality of latching temperatures, and
   a first electrical contact; and
   at least one pawl comprising the at least one holding latch; and
   a plurality of second electrical contacts disposed at a plurality of electrical contact distances from the first electrical contact, the plurality of electrical contact distances corresponding to a plurality of electrical contact temperatures;
   wherein the plurality of latches moves toward the at least one holding latch and the first electrical contact moves toward the plurality of electrical contacts when the thermal bimorph experiences a temperature change in the direction of the plurality of contact temperatures; and
   wherein at least one of the plurality of latches engages with at least one holding latch when the temperature reaches any of the plurality of latching temperatures; and
   wherein the first electrical contact contacts with at least one of the plurality of electrical contacts when the temperature reaches the plurality of electrical contact temperatures.

23. The micro-electromechanical temperature sensor device of claim 22, further comprising at least one actuator mechanically coupled to the at least one pawl for unlatching the at least one holding latch from the plurality of latches.

24. The micro-electromechanical temperature sensor device of claim 23, wherein the at least one actuator does not engage the at least one pawl during latching.

25. The micro-electromechanical temperature sensor device of claim 23, wherein the at least one actuator does not apply a mechanical load onto the at least one pawl during latching.

26. The micro-electromechanical temperature sensor device of claim 23, wherein the at least one actuator is a thermal actuator.

27. The micro-electromechanical temperature sensor device of claim 23, wherein the at least one actuator is a capacitive actuator.

28. A method for sensing temperature using a micro-electromechanical device, comprising the steps of:
   fabricating a micro-electromechanical temperature sensor device, comprising:
   a thermal bimorph comprising:
   a first mechanical latch and
   a first electrical contact; and
   a pawl comprising a second mechanical latch, the second mechanical latch disposed at a latching distance from the first mechanical latch, the latching distance corresponding to a latching threshold temperature; and
   a second electrical contact disposed at an electrical contact distance from the first electrical contact, the electrical contact distance corresponding to an electrical contact threshold temperature;
   wherein the first mechanical latch moves toward the second mechanical latch and the first electrical contact moves toward the second electrical contact when the thermal bimorph experiences a temperature change in the direction of the threshold temperature; and wherein the first mechanical latch engages with the second mechanical latch when the temperature reaches the latching threshold temperature; and wherein the first electrical contact contacts with the second electrical contact when the temperature reaches the electrical contact threshold temperature; and installing the sensor in a location in which temperature is desired to be monitored.

* * * * *